(12) United States Patent
Imafuji et al.

(10) Patent No.: US 9,899,304 B2
(45) Date of Patent: Feb. 20, 2018

(54) WIRING SUBSTRATE AND SEMICONDUCTOR DEVICE

(71) Applicant: SHINKO ELECTRIC INDUSTRIES CO., LTD., Nagano-Shi, Nagano-Ken (JP)

(72) Inventors: Kei Imafuji, Nagano (JP); Keiji Yoshizawa, Nagano (JP); Hirokazu Yoshino, Nagano (JP); Kenta Uchiyama, Tempe, AZ (US)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/381,916

(22) Filed: Dec. 16, 2016

(65) Prior Publication Data
US 2017/0186677 A1    Jun. 29, 2017

(30) Foreign Application Priority Data
Dec. 25, 2015 (JP) ................................. 2015-255103

(51) Int. Cl.
*H01L 23/00* (2006.01)
*H01L 23/498* (2006.01)
*H01L 21/48* (2006.01)
*H01L 21/768* (2006.01)

(52) U.S. Cl.
CPC ...... *H01L 23/49816* (2013.01); *H01L 21/481* (2013.01); *H01L 21/4853* (2013.01); *H01L 21/76805* (2013.01); *H01L 23/49811* (2013.01); *H01L 23/49838* (2013.01); *H01L 24/12* (2013.01); *H01L 24/16* (2013.01); *H01L 2224/16237* (2013.01)

(58) Field of Classification Search
CPC ............................ H01L 21/4814; H01L 21/71
See application file for complete search history.

(56) References Cited

U.S. PATENT DOCUMENTS

| 5,453,403 | A | * | 9/1995 | Meng | H01L 21/76804 257/E21.578 |
| 2009/0296364 | A1 | * | 12/2009 | Yamamoto | H01L 21/563 361/820 |
| 2013/0328211 | A1 | * | 12/2013 | Shimizu | H01L 23/481 257/774 |

FOREIGN PATENT DOCUMENTS

| JP | 2008-258373 A | 10/2008 |
| JP | 2011-258590 A | 12/2011 |

* cited by examiner

*Primary Examiner* — Cheung Lee
(74) *Attorney, Agent, or Firm* — Tarolli, Sundheim, Covell & Tummino LLP

(57) ABSTRACT

A wiring substrate includes a first wiring layer that is an uppermost wiring layer, a protective insulation layer that covers the first wiring layer, and a first through hole that extends through the protective insulation layer in a thickness-wise direction to partially expose an upper surface of the first wiring layer. The first through hole includes a recess defined in an upper surface of the protective insulation layer by a curved wall surface and an opening that extends from the upper surface of the first wiring layer to a bottom of the recess and is in communication with the recess. The opening is smaller than the recess in a plan view.

12 Claims, 14 Drawing Sheets

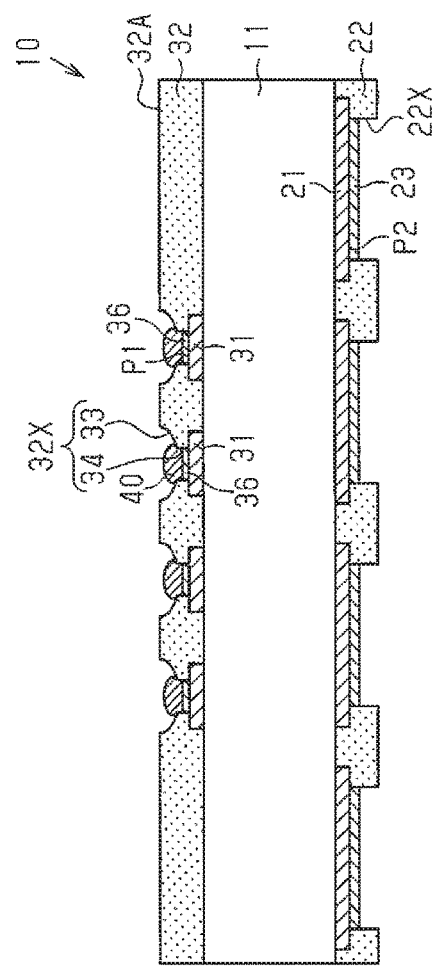
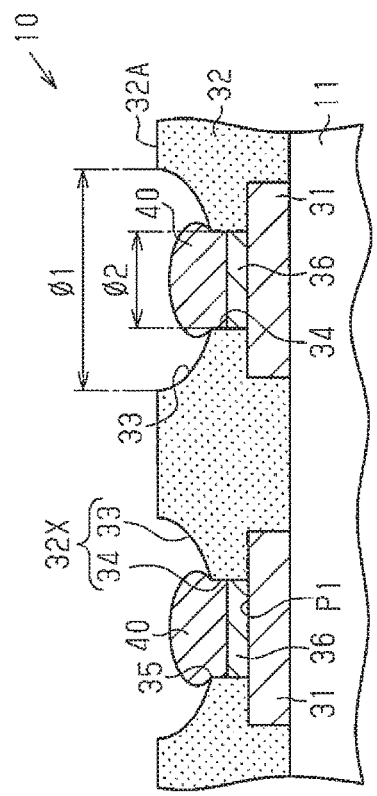
Fig.1A
Fig.1B

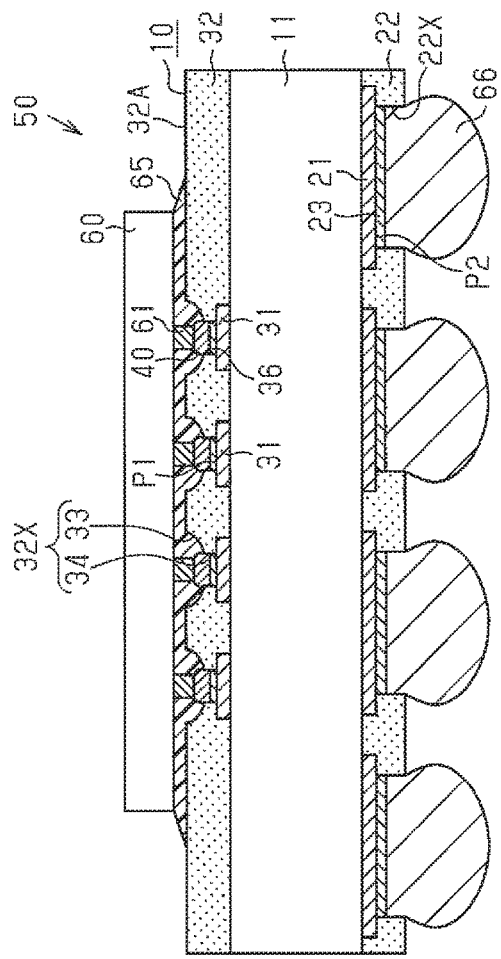
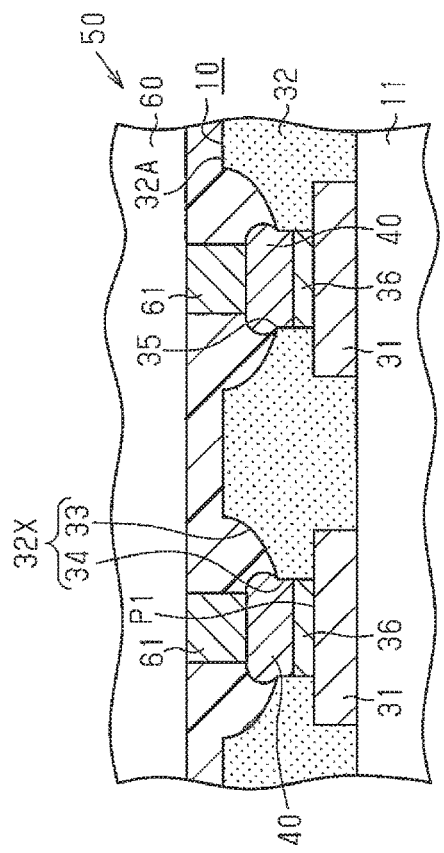
Fig.2A
Fig.2B

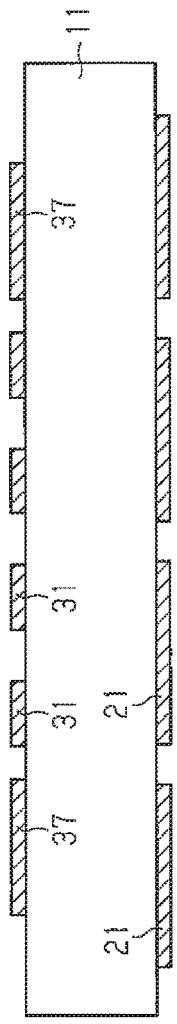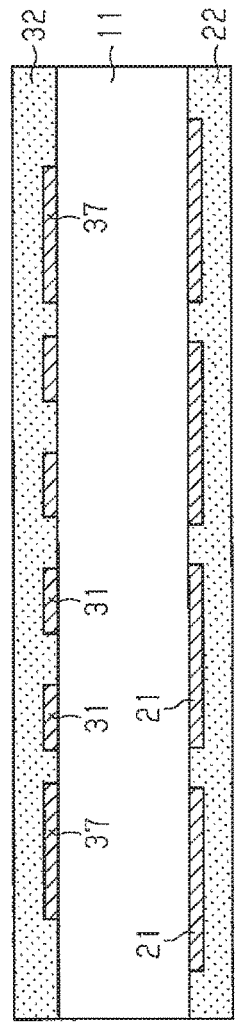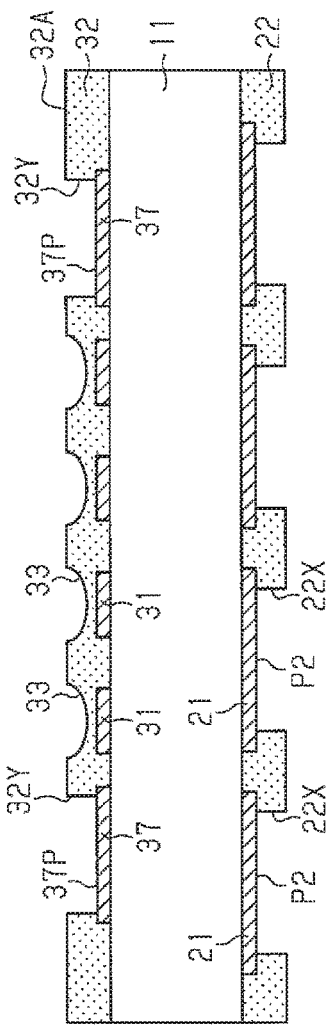
Fig. 10A
Fig. 10B
Fig. 10C

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2015-255103, filed on Dec. 25, 2015, the entire contents of which are incorporated herein by reference.

FIELD

This disclosure relates to a wiring substrate, a semiconductor device, and a method for manufacturing a wiring substrate.

BACKGROUND

When an electronic component such as a semiconductor chip is mounted on a wiring substrate, the outermost layer of the wiring substrate is formed from an insulation material that is referred to as a solder resist. The solder resist protects the wiring substrate from solder, contamination, and the like. The solder resist includes openings that expose a wiring layer, which is located below the solder resist, as electronic component mount pads. The electronic component mount pads are connected to the electronic component. Japanese Laid-Open Patent Publication Nos. 2011-258590 and 2008-258373 each describe an example of the wiring substrate.

FIG. 17 is a partially enlarged cross-sectional view of a wiring substrate in the related art. A wiring layer 101 is formed on an upper surface of an insulation layer 100, and a solder resist layer 102 is formed on the upper surface of the insulation layer 100 to cover the wiring layer 101. The solder resist layer 102 includes through holes 102X, which partially expose the wiring layer 101 as electronic component mount pads 101P. The through holes 102X are formed, for example, through photolithography. Each pad 101P includes, for example, a solder bump used for connection with an electronic component. The solder bump is formed by mounting a solder ball on the pad 101P and melting the solder ball. In the solder resist layer 102, each through hole 102X is defined by a curved wall surface to improve the mounting of the solder ball.

Sophistication of recent semiconductor chip has increased the number of connection terminals (pins) arranged in a semiconductor chip and narrowed the pitch of the connection terminals. Thus, there is demand for a wiring substrate that includes pads arranged at a narrow pitch (e.g., a pitch of 50 μm or less). However, the curved wall surface of the through hole 102X increases the bore diameter Φ10 of the through hole 102X. Consequently, the through holes 102X impose limitations on the arrangement of the pads 101P. Thus, it is difficult to narrow the pitch of the pads 101P.

SUMMARY

One embodiment of this disclosure is a wiring substrate. The wiring substrate includes a first wiring layer that is an uppermost wiring layer, a protective insulation layer that covers the first wiring layer, and a first through hole that extends through the protective insulation layer in a thickness-wise direction to partially expose an upper surface of the first wiring layer. The first through hole includes a recess defined in an upper surface of the protective insulation layer by a curved wall surface and an opening that extends from the upper surface of the first wiring layer to a bottom of the recess and is in communication with the recess. The opening is smaller than the recess in a plan view.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating a first embodiment of a wiring substrate;

FIG. 1B is a partially enlarged cross-sectional view of the wiring substrate illustrated in FIG. 1A;

FIG. 2A is a schematic cross-sectional view of a semiconductor device including the wiring substrate of FIG. 1A;

FIG. 2B is a partially enlarged cross-sectional view of the semiconductor device illustrated in FIG. 2A;

FIGS. 10A to 10C, 11A to 11C, 12A, and 12B are schematic cross-sectional views of a method for manufacturing the wiring substrate of FIG. 7A;

DESCRIPTION OF THE EMBODIMENTS

Figure 3A:
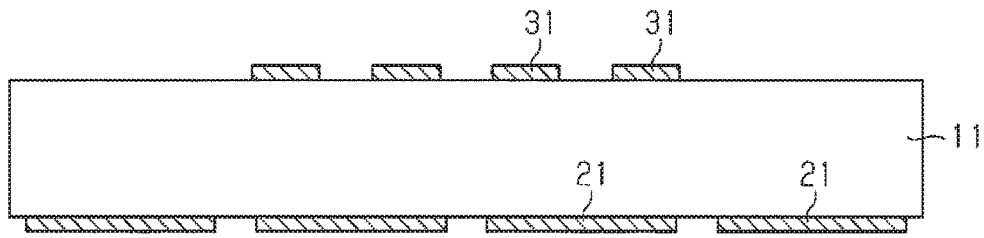
FIGS. 3A to 3C and 4A to 4C are schematic cross-sectional views of a method for manufacturing the wiring substrate of FIG. 1A.

One embodiment will now be described with reference to the accompanying drawings. Elements in the drawings may be partially enlarged for simplicity and clarity and thus have not necessarily been drawn to scale. To facilitate understanding, hatching lines may not be shown or replaced by shadings in the cross-sectional drawings.

First Embodiment

A first embodiment will now be described with reference to FIGS. 1A to 6C.

As illustrated in FIG. 1A, a wiring substrate 10 includes a substrate body 11. The substrate body 11 includes a lower surface on which a wiring layer 21 and a solder resist layer 22 are sequentially formed. The substrate body 11 also includes an upper surface on which a wiring layer 31 and a solder resist layer 32 are sequentially formed.

The substrate body 11 may be, for example, a core substrate, a build-up core substrate that includes a core substrate, or a coreless substrate that is free of a core substrate. When a coreless substrate is used as the substrate body 11, the substrate body 11 may be formed, for example, so that the uppermost insulation layer of the substrate body 11 covers a side surface and a lower surface of the wiring layer 31, which is the uppermost wiring layer, and exposes an upper surface of the wiring layer 31.

The material of the wiring layers 21, 31 may be, for example, copper (Cu) or a copper alloy. The material of the solder resist layers 22, 32 may be, for example, a photosensitive insulative resin, the main component of which is a phenol resin or a polyimide resin. The solder resist layers 22, 32 may contain, for example, a filler such as silica or alumina.

The wiring layer 31 is formed on the upper surface of the substrate body 11. In the present example, the wiring layer 31 is the uppermost wiring layer of the wiring substrate 10. The substrate body 11 includes inner wiring layers and through electrodes that electrically connect the wiring layer 31 and the wiring layer 21.

The solder resist layer 32 (protective insulation layer) is formed on the upper surface of the substrate body 11 to partially cover the wiring layer 31. The thickness of the solder resist layer 32 may be, for example, approximately 15 to 25 μm from an upper surface of the wiring layer 31 to an upper surface 32A of the solder resist layer 32.

The solder resist layer 32 includes through holes 32X, which partially expose the upper surface of the wiring layer 31 as connection pads P1. The connection pads P1 are each an electronic component mount pad used for electrical connection with an electronic component such as a semiconductor chip 60 (refer to FIG. 2A).

As illustrated in FIG. 1B, each through hole 32X is defined by a wall surface that includes a step at an intermediate position in the thickness-wise direction. The through hole 32X includes a recess 33, which is formed in the upper surface 32A of the solder resist layer 32, and an opening 34, which extends from the upper surface of the wiring layer 31 to the bottom of the recess 33 and is in communication with the recess 33. The opening 34 is smaller than the recess 33 in a plan view. The through hole 32X has the form of a stemmed bowl with the step defining the recess 33 and the opening 34.

The recess 33 extends from the upper surface 32A of the solder resist layer 32 to the intermediate position of the solder resist layer 32 in the thickness-wise direction. Thus, the bottom surface of the recess 33 is located at the intermediate position of the solder resist layer 32 in the thickness-wise direction. The recess 33 is wider toward an upper end of the recess 33 (upper surface 32A of solder resist layer 32) from the bottom surface of the recess 33. The wall surface of the recess 33 is concaved and rounded in a cross-sectional view. That is, the wall surface of the recess 33 is curved. The wall surface of the recess 33 is, for example, curved (tractrix arcuate) from the upper end of the recess 33 (upper surface 32A of solder resist layer 32) to a lower end of the recess 33 in a cross-sectional view. In other words, the recess 33 extends from the upper surface 32A of the solder resist layer 32 toward the wiring layer 31 so that the wall surface is elliptically arcuate in a cross-sectional view. Thus, the recess 33 is semielliptical in a cross-sectional view and circular in a plan view.

The opening 34 is formed in a portion of the bottom of the recess 33 to partially expose the upper surface of the wiring layer 31. In the present example, the opening 34 is defined by a wall surface that is linear in a cross-sectional view. The wall surface of the opening 34 is, for example, orthogonal to the upper surface of the wiring layer 31. Thus, the opening 34 is rectangular in a cross-sectional view. The wall surface of the opening 34 extends, for example, linearly (straight) from the bottom surface of the recess 33 (upper end of opening 34) to the upper surface of the wiring layer 31 (lower end of opening 34) in a cross-sectional view. The opening 34 is, for example, circular in a plan view in the same manner as the recess 33. However, the bore diameter $\Phi 2$ of the upper end of the opening 34 is set to be smaller than the bore diameter $\Phi 1$ of the upper end of the recess 33. The bore diameter $\Phi 1$ of the recess 33 may be, for example, approximately 40 to 50 μm. The bore diameter $\Phi 2$ of the opening 34 may be, for example, approximately 15 to 20 μm. The depth of the recess 33 may be, for example, approximately 10 to 15 μm. The depth of the opening 34 may be, for example, approximately 5 to 10 μm. The wall surface of the opening 34 may be rough.

As described above, the wall surface of the through hole 32X includes the step formed by the wall surface of the recess 33 and the wall surface of the opening 34. Thus, the wall surface of the through hole 32X includes a corner 35 that connects the lower end of the wall surface of the recess 33 and the upper end of the wall surface of the opening 34.

If necessary, a surface finish layer 36 is formed on the upper surface of the wiring layer 31 exposed by the through holes 32X as the connection pads P1. The surface finish layer 36 covers, for example, the entire upper surface of the wiring layer 31 exposed by the through holes 32X. In the present example, the upper surface of the surface finish layer 36 is located at a lower position than the corner 35. In other words, the thickness of the surface finish layer 36 is less than the depth of the opening 34.

One example of the surface finish layer 36 is a gold (Au) layer. Another example is a nickel (Ni) layer/Au layer, that is, a metal layer in which the Ni layer serves as the bottom layer, and the Au layer is formed on the Ni layer. Another example is a nickel (Ni) layer/palladium (Pd) layer/Au layer, that is, a metal layer in which the Ni layer serves as the bottom layer, and the Ni layer, the Pd layer, and the Au layer are sequentially formed. Another example is an Ni layer/Pd layer, that is, a metal layer in which the Ni layer serves as the bottom layer, and the Pd layer is formed on the Ni layer. Another example is a Pd layer/Au layer, that is, a metal layer in which the Pd layer serves as the bottom layer, and the Au layer is formed on the Pd layer. The Au layer is a metal layer of Au or an Au alloy. The Ni layer is a metal layer of Ni or an Ni alloy (Ni—P, Ni—B, Ni—W, Ni—W—P, etc.). The Pd layer is a metal layer of Pd or a Pd alloy (Pd—P, etc.). The Au layer, the Ni layer, and the Pd layer may each be, for example, an electroless plating metal layer formed through electroless plating or an electrolytic plating metal layer formed through electrolytic plating. Alternatively, the surface finish layer 36 may be formed by performing an anti-oxidation process such as an organic solderability preservative (OSP) process on the upper surface of the wiring layer 31 exposed by the through hole 32X. For example, when the OSP process is performed, the surface finish layer 36 of an organic coating formed from an azole compound or an imidazole compound is formed on the upper surface of the wiring layer 31.

Each connection pad P1 may have any planar shape and size. For example, in the same manner as the opening 34, the connection pad P1 may have a circular planar shape having a diameter of approximately 15 to 40 μm. The pitch of the connection pads P1 may be, for example, approximately 30 to 70 μm. In the surface finish layer 36, the thickness of the Ni layer may be, for example, approximately, 0.01 to 30 μm. The thickness of the Pd layer may be, for example, approximately 0.01 to 1 μm. The thickness of the Au layer may be, for example, approximately 0.01 to 1 μm. The thickness of the OSP film may be, for example, approximately 0.005 to 0.5 μm.

Solder bumps 40 are formed on the upper surface of the surface finish layer 36. The solder bumps 40 cover, for example, the entire upper surface of the surface finish layer 36. Further, each solder bump 40 covers, for example, the corner 35 of the corresponding through hole 32X and a portion of the bottom of the recess 33. In other words, the corner 35 is embedded in the solder bump 40. Since the metal of the surface finish layer 36 may diffuse into the solder bump 40, the surface finish layer 36 may be lost. In this case, the solder bump 40 covers the entire upper surface of the wiring layer 31. In another case, the surface finish layer 36 may be partially lost due to the diffusion of the metal of the surface finish layer 36 into the solder bump 40. In this case, the solder bump 40 covers the upper surface of the remaining surface finish layer 36. The material of the solder bump 40 may be, for example, a eutectic solder or a lead (Pb)-free solder (Sn—Ag type, Sn—Cu type, Sn—Ag—Cu type, etc.). The pitch of the solder bumps 40 may be, for example, approximately 30 to 50 μm in the same manner as the connection pads P1.

As illustrated in FIG. 1A, the wiring layer 21 is formed on the lower surface of the substrate body 11. The wiring layer 21 is the lowermost wiring layer of the wiring substrate 10.

The solder resist layer 22 is formed on the lower surface of the substrate body 11 to partially cover the wiring layer 21. The solder resist layer 22 includes through holes 22X, which partially expose the lower surface of the wiring layer 21 as external connection pads P2. The external connection pads P2 are connected to external connection terminals 66 (refer to FIG. 2A), which are used to mount the wiring substrate 10 on a mount board such as a motherboard.

In the present example, each through hole 22X is defined by a wall surface that is orthogonal to the lower surface of the wiring layer 21. However, the shape of the through hole 22X is not particularly limited. The wall surface of the through hole 22X may be curved. Alternatively, the through hole 22X may be tapered.

If necessary, a surface finish layer 23 is formed on the lower surface of the wiring layer 21 exposed by the through holes 22X. For example, an Au layer, an Ni layer/Au layer, an Ni layer/Pd layer/Au layer, an Ni layer/Pd layer, or a Pd layer/Au layer may be used as the surface finish layer 23 in the same manner as the surface finish layer 36. Alternatively, the surface finish layer 23 may be an OSP film formed through an OSP process. The OSP film may be, for example, an organic coating formed from an azole compound or an imidazole compound. For example, when the surface finish layer 23 is formed on the lower surface of the wiring layer 21, the surface finish layer 23 functions as the external connection pads P2.

In the present example, the external connection terminals 66 (refer to FIG. 2A) are arranged on the surface finish layer 23. Instead, the wiring layer 21 exposed by the through holes 22X may be used as the external connection terminals. Alternatively, the surface finish layer 23 formed on the wiring layer 21 may be used as the external connection terminals.

The structure of a semiconductor device 50 will now be described with reference to FIGS. 2A and 2B. As illustrated in FIG. 2A, the semiconductor device 50 includes the wiring substrate 10, one or more (here, one) semiconductor chips 60, an underfill 65, and the external connection terminals 66.

As illustrated in FIG. 2B, the semiconductor chip 60 includes a circuit formation surface (here, lower surface) on which connection terminals 61 are formed. The semiconductor chip 60 is flip-chip-mounted on the wiring substrate 10. When the connection terminals 61 are bonded to the solder bumps 40, which are bonded to the surface finish layer 36, the semiconductor chip 60 is electrically connected to the surface finish layer 36 of the wiring substrate 10 by the connection terminals 61 and the solder bumps 40.

The semiconductor chip 60 may be, for example, a logic chip such as a central processing unit (CPU) chip or a graphics processing unit (GPU) chip. Additionally, the semiconductor chip 60 may be, for example, a memory chip such as a dynamic random access memory (DRAM) chip, a static random access memory (SRAM) chip, or a flash memory chip. Further, a plurality of semiconductor chips 60 including a combination of a logic chip and a memory chip may be mounted on the wiring substrate 10.

Each connection terminal 61 may be, for example, a metal post. The connection terminal 61 is rod-shaped or column-shaped and downwardly extends from the circuit formation surface of the semiconductor chip 60. In the present example, the connection terminal 61 is circular rod-shaped. The material of the connection terminal 61 may be, for example, copper or a copper alloy. Instead of the metal post, for example, a metal bump such as a gold bump may be used as the connection terminal 61.

As illustrated in FIG. 2A, a gap between the wiring substrate 10 and the semiconductor chip 60 is filled with the underfill 65. The material of the underfill 65 may be, for example, an insulative resin such as an epoxy resin.

The external connection terminals 66 are formed on the surface finish layer 23 of the wiring substrate 10. The external connection terminals 66 are, for example, electrically connected to pads that are arranged on the mount board such as a motherboard (not illustrated). The external connection terminals 66 may each be, for example, a solder ball or a lead pin. In the present embodiment, solder balls are used as the external connection terminals 66.

In the present embodiment, the wiring layer 31 is one example of a first wiring layer. The solder resist layer 32 is one example of a protective insulation layer. The through hole 32X is one example of a first through hole.

A method for manufacturing the wiring substrate 10 will now be described.

In the step of FIG. 3A, the wiring layer 21 is formed on the lower surface of the substrate body 11. The wiring layer 31 is formed on the upper surface of the substrate body 11.

Figure 3B:
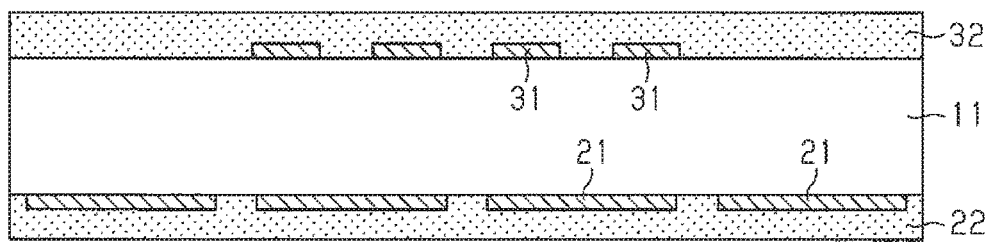

In the step of FIG. 3B, the solder resist layer 22 is formed on the lower surface of the substrate body 11 to cover the entire surfaces (lower and side surfaces) of the wiring layer 21. The solder resist layer 32 is formed on the upper surface of the substrate body 11 to cover the entire surfaces (upper and side surfaces) of the wiring layer 31. The solder resist layers 22, 32 may be formed, for example, by laminating a photosensitive solder resist film or applying a liquid solder resist. In the present embodiment, a positive-type photosensitive resin is used as the material of the solder resist layers 22, 32. Alternatively, a negative-type photosensitive resin may be used as the material of the solder resist layers 22, 32.

Figure 3C:
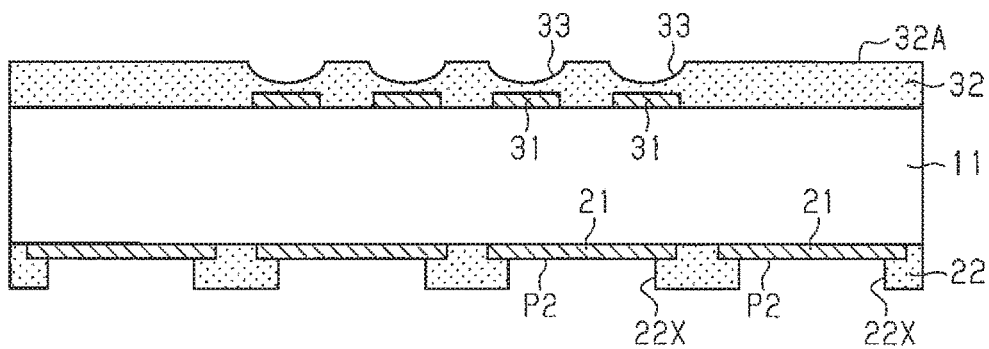

In the step of FIG. 3C, photolithography is performed on the solder resist layer 22 to form the through holes 22X in the solder resist layer 22 at given locations. The through holes 22X partially expose the lower surface of the wiring layer 21 as the external connection pads P2. Also, photolithography is performed on the solder resist layer 32 to form the recesses 33 in the upper surface 32A of the solder resist layer 32 at portions overlapping with the wiring layer 31 in a plan view.

Figure 4A:
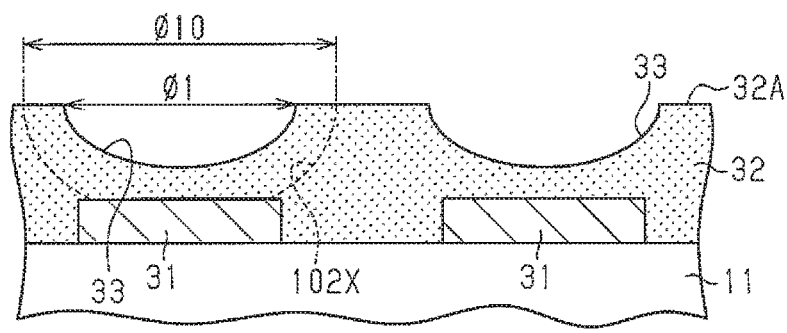

As illustrated in FIG. 4A, the bottom surface of each recess 33 is located at an intermediate position of the solder resist layer 32 in the thickness-wise direction. Thus, the recess 33 has a depth that does not reach the upper surface of the wiring layer 31. The recess 33 is semielliptical in a cross-sectional view. The recess 33 may be formed, for example, as follows.

The solder resist layer 32, which is formed from a positive-type photosensitive resin layer, undergoes exposure through a photo mask (not illustrated). The photo mask includes openings at positions corresponding to the recesses 33. In this case, the exposure amount (exposure time) and the transmittance to the openings of the photo mask are adjusted so that portions of the solder resist layer 32 overlapping with the wiring layer 31 in a plan view are exposed to an intermediate position in the thickness-wise direction. That is, the portions of the solder resist layer 32 overlapping with the wiring layer 31 in a plan view are exposed to the depth that does not reach the upper surface of the wiring layer 31. Then, the solder resist layer 32 is developed. The development removes the exposed portions of the solder resist layer 32 while non-exposed portions of the solder resist layer 32 remain. This forms the recesses 33 in the upper surface 32A of the solder resist layer 32. The exposure step obtains the curved wall surface of the recess 33.

Figure 17:
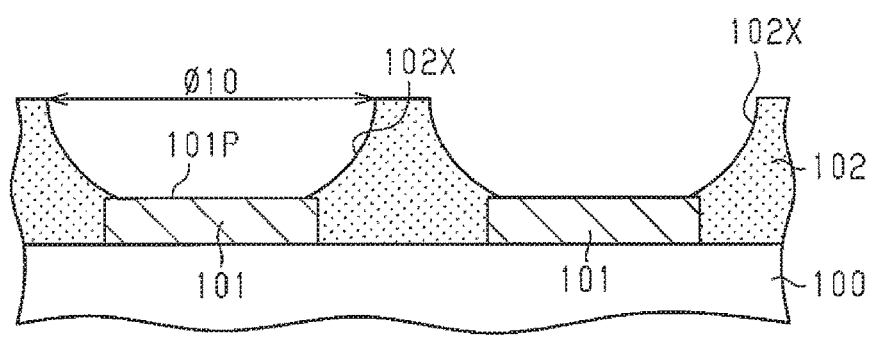
FIG. 17 is a schematic cross-sectional view of a related art wiring substrate.

In the wiring substrate of FIG. 17, the solder resist layer 102 is exposed to the depth that reaches the upper surface of the wiring layer 101. This forms the through holes 102X, which expose the wiring layer 101. In this case, the bore diameter Φ10 of the upper end of each through hole 102X is large. Thus, it is difficult to narrow the pitch of the through holes 102X. In this regard, in the present embodiment, the bottom surface of each recess 33 is located at the intermediate position of the solder resist layer 32 in the thickness-wise direction. Thus, the bore diameter Φ1 of the recess 33 is small.

Figure 4B:
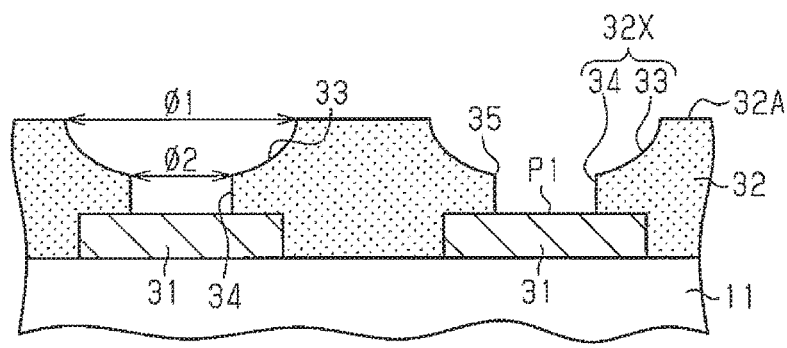

In the step of FIG. 4B, the opening 34 is formed in the bottom surface of each recess 33 to partially expose the wiring layer 31 as the connection pad P1. The opening 34, which extends through the solder resist layer 32 from the upper surface of the wiring layer 31 to the bottom surface of the recess 33, is in communication with the recess 33. Consequently, the through hole 32X is formed by the recess 33 and the opening 34. The opening 34 may be formed through laser processing using a $CO_2$ laser, a YAG laser, or the like. Such laser processing easily forms the opening 34, which has a smaller diameter than the recess 33. When the opening 34 is formed through laser processing, the wall surface of the opening 34 is linear in a cross-sectional view. Additionally, the opening 34 formed through laser processing has a rough wall surface.

Figure 5A:
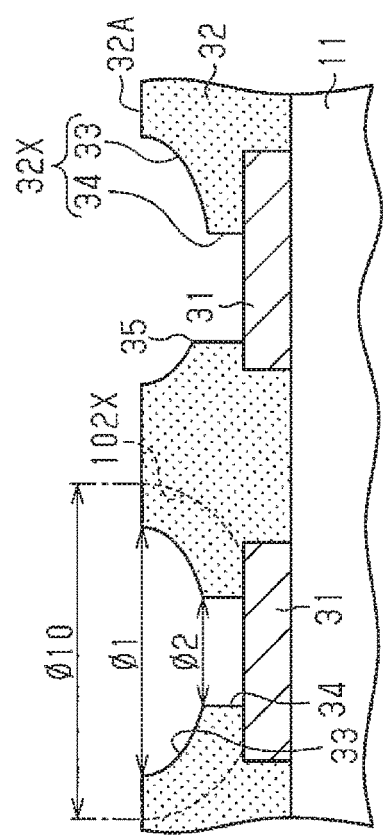
FIG. 5A is an enlarged cross-sectional view illustrating the operation of the wiring substrate of FIG. 1A.
Figure 5B:
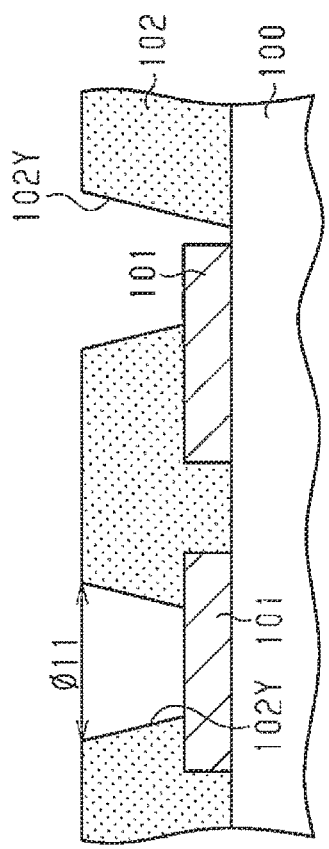
FIG. 5B is an enlarged cross-sectional view of a related art wiring substrate.

As illustrated in FIG. 5B, instead of the through holes 102X (refer to FIG. 17), tapered through holes 102Y may be formed in the solder resist layer 102. The through holes 102Y may be formed, for example, through laser processing. Laser processing is capable of forming the through hole 102Y of a small diameter. However, the alignment accuracy of laser processing is lower than that of photolithography. Thus, as illustrated at the right side in FIG. 5B, when the through hole 102Y has a small diameter, the through hole 102Y may be displaced from the wiring layer 101 (pad). Additionally, when forming the through hole 102Y of a small diameter in the thick solder resist layer 102, as the laser spot diameter decreases, it becomes more difficult to perform laser processing because of the focal depth of the laser beam. This may hinder the laser beam from reaching the wiring layer 101 and fail to form the through holes 102Y.

In this regard, in the present embodiment, after performing photolithography to form the recess 33 defined by the curved wall surface, laser processing is performed to form the opening 34, which has a smaller diameter than the recess 33, in the bottom surface of the recess 33. In this manner, the through holes 32X are formed by the two steps of photolithography and laser processing. Thus, as illustrated in FIGS. 5A and 5B, laser processing is used to form the opening 34 having a smaller depth than the through hole 102Y. Hence, the bore diameter Φ2 of the upper end of the opening 34 is set to be smaller than the bore diameter Φ11 of the upper end of the through hole 102Y. This limits displacement of the opening 34 from the wiring layer 31 (pad) even when the position of the opening 34 is deviated from the designed position caused by the alignment accuracy of laser processing. Thus, the high alignment accuracy is not necessary when performing laser processing (forming opening 34). This further narrows the pitch of the through holes 32X (openings 34). Additionally, after the recesses 33 are formed, the openings 34 are formed. Thus, the thickness of the solder resist layer 32 is reduced when forming the openings 34. This limits situations in which the laser beam does not reach the wiring layer 31 and fails to form the through holes 32X.

Then, a desmear process and Cu etching are performed to remove resin smears (resin residues) from the upper surface of the wiring layer 31 exposed by the openings 34.

Figure 4C:
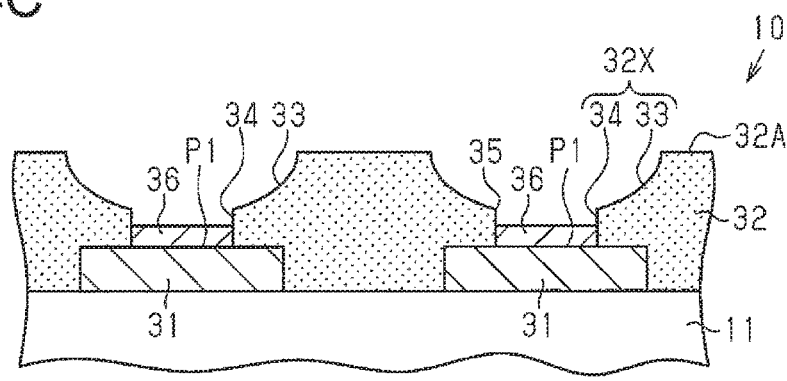

In the step of FIG. 4C, the surface finish layer 36 is formed on the upper surface of the wiring layer 31 exposed by the openings 34. For example, when an Ni layer/Pd layer/Au layer is used as the surface finish layer 36, the Ni layer, the Pd layer, and the Au layer are sequentially formed on the upper surface of the wiring layer 31 to form the surface finish layer 36. The Ni layer, the Pd layer, and the Au layer may be formed, for example, through electroless plating. Although not illustrated in the drawing, in the step of FIG. 4C, the surface finish layer 23 is also formed on the lower surface of the wiring layer 21 exposed by the through holes 22X, which are illustrated in FIG. 3C.

Figure 6A:
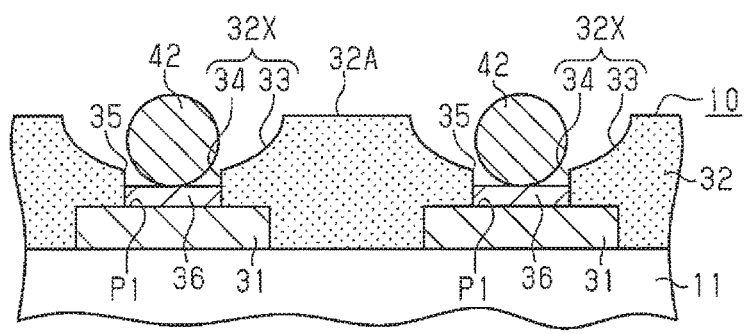
FIGS. 6A and 6B are schematic cross-sectional views of the method for manufacturing the wiring substrate subsequent to the step of FIG. 4C.

In the step of FIG. 6A, after a flux is appropriately applied to the surface finish layer 36, spherical solder balls 42 are mounted on the surface finish layer 36. For example, a transfer jig (not illustrate) is used to transfer the solder balls 42 into the through holes 32X of the solder resist layer 32. The bore diameter Φ1 (refer to FIG. 5A) of the upper end of the through hole 32X (i.e., upper end of recess 33) is larger than the bore diameter Φ11 (refer to FIG. 5B) of the upper end of the through hole 102Y, which is formed through laser processing. Thus, the solder balls 42 are transferred into the through holes 32X more easily than when the solder balls 42 are transferred into the through holes 102Y. Additionally, the wall surface of the recess 33 of the through hole 32X is curved. This improves the mounting of the solder balls 42 on the surface finish layer 36 compared to when the recesses 33 are tapered.

Figure 6B:
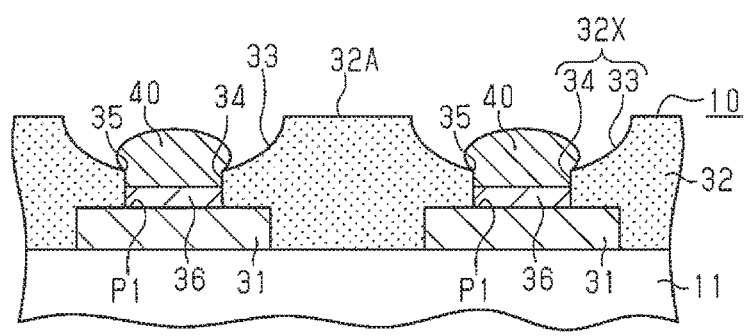

In the step of FIG. 6B, the wiring substrate 10, on which the solder balls 42 are mounted, undergoes a reflow process to form the solder bumps 40 on the surface finish layer 36. In this case, prior to the reflow process, the surface finish layer 36 is formed in the shallow openings 34 of the small diameter. Thus, the solder balls 42, which are transferred into the through holes 32X, appropriately come into contact with the upper surface of the surface finish layer 36. This limits formation of voids in the solder bumps 40 during the reflow process. Further, the wall surface of the through hole 32X includes the step formed by the wall surface of the recess 33 and the wall surface of the opening 34. Thus, when a lower portion of each solder ball 42 is located in the opening 34, the solder ball 42 is appropriately held in the through hole 32X. This restricts movement of the solder ball 42 out of the opening 34 during the reflow process and limits the occurrence of missing bumps in the surface finish layer 36.

When the flux has been applied to the surface finish layer 36 to bond the solder bumps 40, the residual flux is removed through cleaning. The above manufacturing steps manufacture the wiring substrate 10 illustrated in FIG. 1A.

A method for manufacturing the semiconductor device 50 will now be described with reference to FIG. 6C.

Figure 6C:
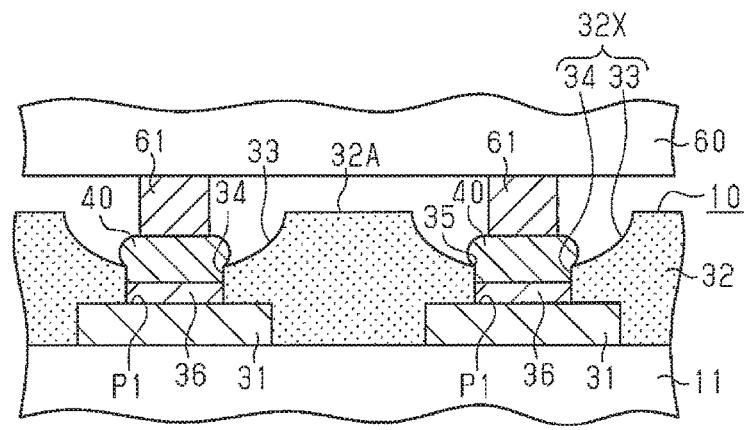
FIG. 6C is a schematic cross-sectional view of a method for manufacturing the semiconductor device of FIG. 2B subsequent to the step of FIG. 6B.

In the step of FIG. 6C, the semiconductor chip 60 including the circuit formation surface, on which the connection terminals 61 are formed, is prepared. When the connection terminals 61 are aligned with the solder bumps 40, the reflow process is performed to melt the solder bumps 40. This flip-chip-bonds the connection terminals 61 of the semiconductor chip 60 to the solder bumps 40 formed on the surface finish layer 36. Consequently, the connection terminals 61 are electrically connected to the surface finish layer 36 by the solder bumps 40.

Each solder bump 40 is surrounded by the concaved and rounded wall surface of the corresponding recess 33. Thus, even if the solder bump 40 is pressed and spread in the planar direction (direction orthogonal to lamination direction of wiring substrate 10) when the semiconductor chip 60 is mounted, the wall surface of the recess 33 restricts the spreading of the solder bump 40. This limits contact of adjacent ones of the solder bumps 40 even when the pitch of the solder bumps 40 is narrow. Hence, the distance between the semiconductor chip 60 and the wiring substrate 10 may be decreased. This limits the occurrence of an open circuit defect, that is, electrical disconnection of the connection terminals 61 from the solder bumps 40, even when the wiring substrate 10 warps or the solder bumps 40 have variations in height.

The gap between the semiconductor chip 60 and the wiring substrate 10, which are flip-chip-bonded to each other, are filled with the underfill 65 (refer to FIG. 2A). Then, the underfill 65 is cured. Additionally, the external connection terminals 66 are formed on the surface finish layer 23, which is illustrated in FIG. 2A. The above manufacturing steps manufacture the semiconductor device 50 illustrated in FIG. 2A.

The first embodiment has the advantages described below.

(1) The through hole 32X, which partially exposes the upper surface of the wiring layer 31, is defined by the recess 33 and the opening 34. The recess 33 is defined in the upper surface 32A of the solder resist layer 32 by the curved wall surface. The opening 34 extends from the upper surface of the wiring layer 31 to the bottom of the recess 33 and is in communication with the recess 33. The opening 34 is smaller than the recess 33 in a plan view. This structure forms the shallow recess 33 defined by the curved wall surface. This allows the recess 33 to have a small diameter while improving the mounting of the solder ball 42. Consequently, the pitch of the recesses 33 (through holes 32X) is narrowed. Accordingly, the pitch of the connection pads P1 (solder bumps 40) is easily narrowed.

The opening 34 is formed in the bottom of the recess 33 to partially expose the upper surface of the wiring layer 31. This allows the opening 34 to be shallower than the through hole 102Y (refer to FIG. 5B) and have a small diameter. Thus, displacement of the opening 34 from the wiring layer 31 (pad) is limited even when the opening 34 is misaligned due to the alignment accuracy of laser processing. Additionally, after the recesses 33 are formed, the openings 34 are formed. Thus, the thickness of the solder resist layer 32 is reduced when forming the openings 34. This limits situations in which the laser beam does not reach the wiring layer 31 and fails to form the through holes 32X.

(2) To narrow the pitch, the thickness of the solder resist layer 102 illustrated in FIG. 17 may be reduced. However, when the thickness of the solder resist layer 102 is reduced, the through holes 102X become shallow. The shallow through holes 102X are incapable of holding the solder when the solder balls undergo the reflow process or the solder bumps are connected to the semiconductor chip. This may cause the solder to leak out of the through holes 102X. Consequently, adjacent ones of the solder bumps would be short-circuited.

In this regard, in the present embodiment, the through holes 32X are formed in a stepped manner. This allows the through holes 32X to have a necessary depth and a small diameter without reducing the thickness of the solder resist layer 32. Thus, the solder is appropriately held in the through holes 32X when the solder balls 42 undergo the reflow process or the solder bumps 40 are connected to the semiconductor chip 60. This limits leakage of the solder out of the through holes 32X thereby limiting short-circuiting of adjacent ones of the solder bumps 40. Consequently, the insulation reliability is ensured.

(3) As illustrated in FIG. 17, when photolithography is performed to form the through holes 102X entirely defined by the curved wall surface, the solder resist layer 102 continuously widens from the upper surface of the wiring layer 101. In this case, the resin residues remain on the upper surface of the wiring layer 101 defining the pads 101P. If a surface finish layer (e.g., Ni layer) is formed on the pads 101P, the resin residues on the pads 101P deteriorate the film quality of the Ni layer. For example, pinholes are formed in the Ni layer. Such deterioration in the film quality of the Ni layer lowers the bonding of the surface finish layer and the solder bump.

In this regard, in the wiring substrate 10, laser processing is performed to form the openings 34, which partially expose the upper surface of the wiring layer 31 as the connection pads P1. Thus, the wall surface of each opening 34 orthogonally extends from the upper surface of the wiring layer 31. This limits resin residues on the connection pad P1 and improves the film quality of the surface finish layer 36. Consequently, the bonding of the surface finish layer 36 and the solder bumps 40 is improved.

(4) The surface finish layer 36 is formed on the upper surface of the wiring layer 31 exposed by the openings 34.

Thus, when the solder balls 42 are transferred into the through holes 32X, the solder balls 42 appropriately come into contact with the upper surface of the surface finish layer 36. This limits formation of voids in the solder bumps 40 during the reflow process.

(5) The upper surface of the surface finish layer 36 is located at a lower position than the corner 35 of each through hole 32X. Thus, when the step (corner 35) formed by the wall surface of the recess 33 and the wall surface of the opening 34 is exposed above the surface finish layer 36, the solder ball 42 is transferred into the through hole 32X. The step restricts movement of the solder ball 42 during the reflow process and limits the occurrence of missing bumps.

(6) The corner 35 of the through hole 32X is embedded into the solder bump 40. This limits separation of the solder bump 40.

(7) The wall surface of the opening 34 is rough. This improves the adhesiveness of the surface finish layer 36 and the solder bump 40 to the wall surface of the opening 34.

Second Embodiment

A second embodiment will now be described with reference to FIGS. 7A to 12C. The same reference characters are given to those elements that are the same as the corresponding elements illustrated in FIGS. 1A to 6C. Such elements will not be described in detail.

Figure 7A:
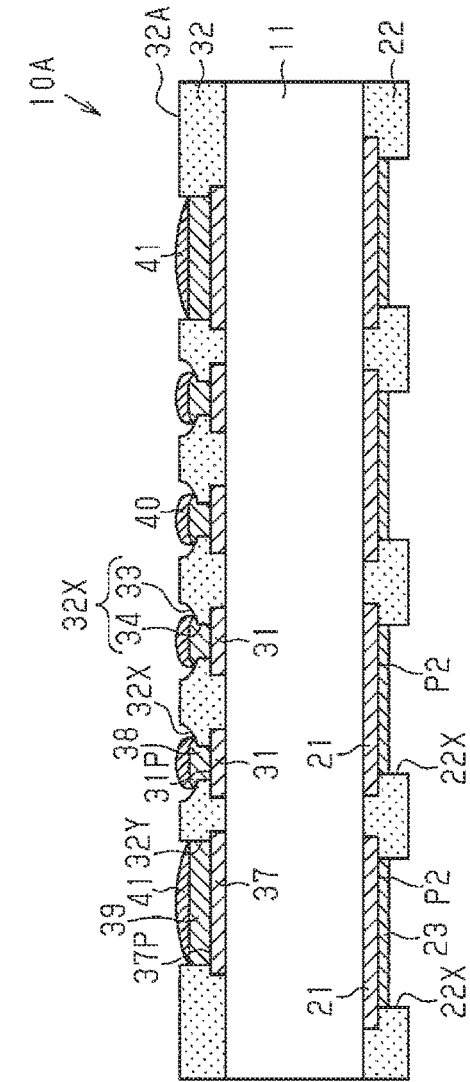
FIG. 7A is a schematic cross-sectional view illustrating a second embodiment of a wiring substrate taken along line 7a-7a in FIG. 8.

As illustrated in FIG. 7A, a wiring substrate 10A includes the substrate body 11. The wiring layer 21 and the solder resist layer 22 are sequentially formed on the lower surface of the substrate body 11. Also, wiring layers 31, 37 and the solder resist layer 32 are sequentially formed on the upper surface of the substrate body 11. The material of the wiring layers 31, 37 may be, for example, copper or a copper alloy.

The wiring layers 31, 37, each of which is the uppermost wiring layer formed on the upper surface of the substrate body 11, are located on the same plane. That is, the wiring layers 31, 37 are located in the same layer. The wiring layers 31, 37 are separated from each other. The wiring layers 31, 37 are electrically connected to the wiring layer 21, for example, by inner wiring layers and through electrodes of the substrate body 11.

The wiring layer 37 includes power supply pads 37P, which are connected to, for example, ground (GND) or a power supply. For example, when the wiring layer 37 is connected to ground or a power supply of an external circuit connected to the wiring substrate 10A, the electric potential of the wiring layer 37 may be fixed to the ground potential or the potential of the power supply. The wiring layer 31 includes, for example, signal pads 31P. The power supply pads 37P are larger than the signal pads 31P in a plan view. The pads 31P, 37P also function as electronic component mount pads, which are used for electrical connection with an electronic component such as the semiconductor chip 60 (refer to FIG. 9A).

Figure 8:
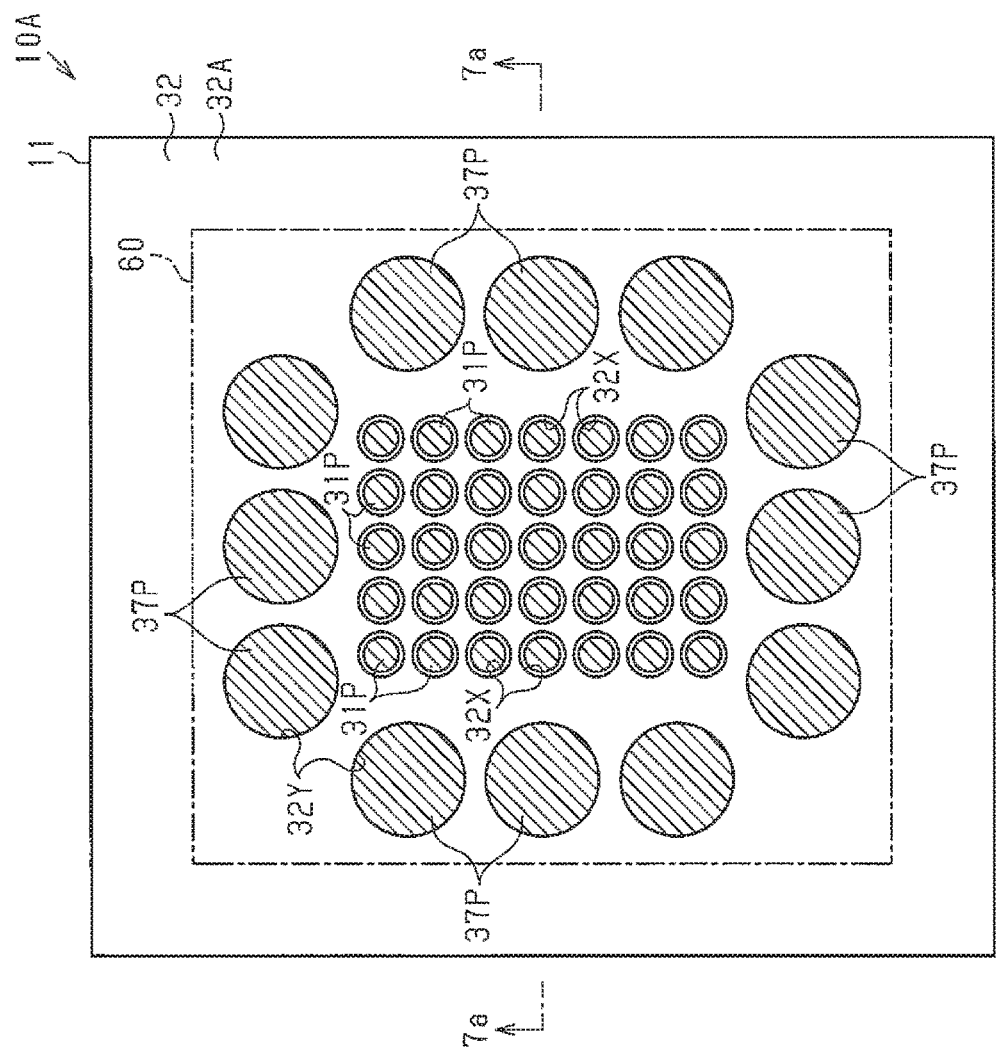
FIG. 8 is a schematic plan view of the wiring substrate illustrated in FIG. 7A.

As illustrated in FIG. 8, each of the pads 31P, 37P is circular in a plan view. The pads 31P are arranged in a central portion of a mount region where, for example, the semiconductor chip 60 is mounted. The pads 31P are arranged, for example, in a matrix in a plan view. The pads 37P are arranged, for example, around the pads 31P. The pads 37P are arranged, for example, in a peripheral manner in a plan view. The diameter of each pad 31P is set to be smaller than the diameter of each pad 37P. The pitch of the pads 31P is set to be narrower than the pitch of the pads 37P. The diameter of each pad 31P may be, for example, approximately 15 to 40 μm. The diameter of each pad 37P may be, for example, approximately 70 to 150 μm. Additionally, the pitch of the pads 31P may be, for example, approximately 30 to 70 μm. The pitch of the pads 37P may be, for example, approximately 100 to 200 μm.

As described above, in the wiring substrate 10A of FIG. 7A, the pads 31P, 37P having different diameters are formed on the upper surface of the substrate body 11, that is, on the same plane.

The solder resist layer 32 (protective insulation layer) is formed on the upper surface of the substrate body 11 to partially cover the wiring layer 31 and the wiring layer 37. The solder resist layer 32 includes the through holes 32X, which expose the wiring layer 31 as the signal pads 31P, and through holes 32Y, which expose the wiring layer 37 as the power supply pads 37P.

Figure 7B:
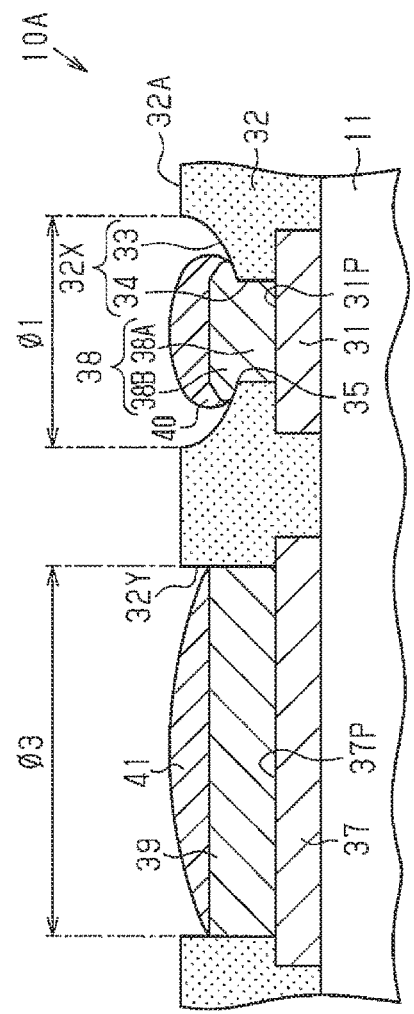
FIG. 7B is a partially enlarged cross-sectional view of the wiring substrate illustrated in FIG. 7A.

As illustrated in FIG. 7B, the through hole 32X exposes the pad 31P, which has a smaller diameter than the pad 37P. The through hole 32X includes the recess 33, which is formed in the upper surface 32A of the solder resist layer 32, and the opening 34, which extends from the upper surface of the wiring layer to the bottom of the recess 33 and is in communication with the recess 33. The opening 34 is smaller than the recess 33 in a plan view.

The recess 33 extends from the upper surface 32A of the solder resist layer 32 to an intermediate position of the solder resist layer 32 in the thickness-wise direction. Thus, the bottom surface of the recess 33 is located at the intermediate position of the solder resist layer 32 in the thickness-wise direction. The recess 33 is wider toward the upper end of the recess 33 (upper surface 32A of solder resist layer 32) from the bottom surface of the recess 33. The wall surface of the recess 33 is concaved and rounded in a cross-sectional view. That is, the wall surface of the recess 33 is curved. The wall surface of the recess 33 is, for example, curved (tractrix arcuate) from the upper end of the recess 33 (upper surface 32A of solder resist layer 32) to the lower end of the recess 33 in a cross-sectional view. In other words, the recess 33 extends from the upper surface 32A of the solder resist layer 32 toward the wiring layer 31 so that the wall surface is elliptically arcuate in a cross-sectional view. Thus, the recess 33 is semielliptical in a cross-sectional view and circular in a plan view.

The opening 34 is formed in a portion of the bottom of the recess 33 to partially expose the upper surface of the wiring layer 31. In the present example, the opening 34 is defined by a wall surface that is linear in a cross-sectional view. The wall surface of the opening 34 is, for example, orthogonal to the upper surface of the wiring layer 31. Thus, the opening 34 is rectangular in a cross-sectional view. The wall surface of the opening 34 extends, for example, linearly (straight) from the bottom surface of the recess 33 (upper end of opening 34) to the upper surface of the wiring layer 31 (lower end of opening 34) in a cross-sectional view. The opening 34 is, for example, circular in a plan view in the same manner as the recess 33. However, the bore diameter Φ2 of the upper end of the opening 34 is set to be smaller than the bore diameter Φ1 of the upper end of the recess 33. The wall surface of the opening 34 may be rough.

As described above, the wall surface of the through hole 32X includes the step formed by the wall surface of the recess 33 and the wall surface of the opening 34. Thus, the wall surface of the through hole 32X includes the corner 35 that connects the lower end of the wall surface of the recess 33 and the upper end of the wall surface of the opening 34.

If necessary, a surface finish layer 38 is formed on the upper surface of the wiring layer 31 exposed by the through hole 32X as the pad 31P. In the present example, the upper surface of the surface finish layer 38 is located at a higher position than the corner 35. The surface finish layer 38 covers, for example, a portion of the bottom of the recess 33 and the corner 35 in the through hole 32X. The surface finish layer 38 is, for example, T-shaped in a cross-sectional view. In the present example, the surface finish layer 38 includes a base portion 38A, with which the opening 34 is filled, and a distal portion 38B, which is formed on the upper surface of the base portion 38A and the bottom of the recess 33. The distal portion 38B is larger than the base portion 38A in a plan view.

The base portion 38A is shaped in conformance with the shape of the opening 34. The base portion 38A is, for example, circular rod-shaped. The distal portion 38B upwardly projects from the upper surface of the base portion 38A and the bottom of the recess 33 to partially cover the bottom (wall surface) of the recess 33. The distal portion 38B is, for example, circular in a plan view.

The diameter of the distal portion 38B is set to be larger than the diameter of the base portion 38A. The diameter of the base portion 38A may be, for example, approximately 15 to 20 μm. The diameter of the distal portion 38B may be, for example, approximately 17 to 40 μm. Additionally, the thickness of the base portion 38A may be, for example, approximately 5 to 10 μm. The thickness of the distal portion 38B may be, for example, approximately 1 to 10 μm. The diameter of the distal portion 38B is approximately set to a value obtained by multiplying the thickness of the distal portion 38B by two and adding the product to the diameter of the base portion 38A.

The surface finish layer 38 may be, for example, an Ni layer/Au layer, an Ni layer/Pd layer, or an Ni layer/Pd layer/Au layer. In the present example, the surface finish layer 38 has a structure in which metal layers including an Ni layer are laminated. In this case, the thickness of the Ni layer is greater than the depth of the opening 34. Thus, the base portion 38A is formed only by the Ni layer, and the distal portion 38B is partially formed by the Ni layer.

The through hole 32Y exposes the pad 37P, which has a larger diameter than the pad 31P. The through hole 32Y is, for example, circular in a plan view in the same manner as the pad 37P. The through hole 32Y is larger than the recess 33 in a plan view. The bore diameter Φ3 of the upper end of the through hole 32Y is set to be, for example, larger than the bore diameter Φ1 of the upper end of the recess 33. The bore diameter Φ3 of the through hole 32Y may be, for example, approximately 70 to 150 μm. The through hole 32Y is, for example, smaller than the through hole 22X (refer to FIG. 7A) in a plan view.

The through hole 32Y is defined by a wall surface that is free of a step (corner). The bore diameter of the through hole 32Y is set to be substantially uniform from the upper surface 32A of the solder resist layer 32 (upper end of through hole 32Y) to the upper surface of the wiring layer 31 (lower end of through hole 32Y). Alternatively, the bore diameter of the through hole 32Y is set to continuously change at a constant rate from the upper end to the lower end of the through hole 32Y. In the present example, the wall surface of the through hole 32Y is linear in a cross-sectional view. The wall surface of the through hole 32Y is, for example, orthogonal to the upper surface of the wiring layer 37. The wall surface of the through hole 32Y extends, for example, linearly (straight) from the upper surface 32A of the solder resist layer 32 (upper end of through hole 32Y) to the upper surface of the wiring layer 37 (lower end of through hole 32Y) in a cross-sectional view. However, the shape of the through hole 32Y is not particularly limited. In one example, the wall surface of the through hole 32Y may be curved. In another example, the through hole 32Y may be tapered. When the through hole 32Y is defined by a curved wall surface, the wall surface of the through hole 32Y is curved, for example, from the upper surface 32A of the solder resist layer 32 (upper end of through hole 32Y) to the upper surface of the wiring layer 37 (lower end of through hole 32Y) in a cross-sectional view. When the through hole 32Y is tapered, the wall surface of the through hole 32Y is, for example, linear from the upper surface 32A of the solder resist layer 32 (upper end of through hole 32Y) to the upper surface of the wiring layer 37 (lower end of through hole 32Y) in a cross-sectional view.

If necessary, a surface finish layer 39 is formed on the upper surface of the wiring layer 37 exposed by the through hole 32Y as the pad 37P. The surface finish layer 39 covers, for example, the entire upper surface of the wiring layer 37 exposed by the through hole 32Y. For example, an Ni layer/Au layer, an Ni layer/Pd layer, or an Ni layer/Pd layer/Au layer may be used as the surface finish layer 39 in the same manner as the surface finish layer 38. When the surface finish layer 39 is formed on the upper surface of the wiring layer 37, the surface finish layer 39 functions as the power supply pad 37P.

As described above, in the wiring substrate 10A, the pads 31P, 37P having different diameters are located on the same plane. Additionally, the solder resist layer 32 includes the through holes 32X, 32Y having different bore diameters (bore widths). The wall surface of the through hole 32X, which has a smaller diameter than the through hole 32Y, includes the step (corner 35). That is, each of the through holes 32X, which are arranged at a narrow pitch, is formed by the recess 33 and the opening 34.

The solder bumps 40 are formed on the upper surface of the surface finish layer 38. Each solder bump 40 covers, for example, the entire surfaces (upper and side surfaces) of the distal portion 38B of the surface finish layer 38. Also, solder bumps 41 are formed on the upper surface of the surface finish layer 39. Each solder bump 41 covers, for example, the entire upper surface of the surface finish layer 39. Since the metal of the surface finish layer 38 may diffuse into the solder bump 40, the surface finish layer 38 may be partially lost. Also, since the metal of the surface finish layer 39 may diffuse into the solder bump 41, the surface finish layer 39 may be partially lost. In this case, the solder bump 40 covers the upper surface of the remaining surface finish layer 38. Also, the solder bump 41 covers the upper surface of the remaining surface finish layer 39. The material of the solder bumps 40, 41 may be, for example, a eutectic solder or a lead (Pb)-free solder (Sn—Ag type, Sn—Cu type, Sn—Ag—Cu type, etc.).

The pitch of the solder bumps 40 is set to be narrower than the pitch of the solder bumps 41. The pitch of the solder bumps 40 may be, for example, approximately 30 to 70 μm. The pitch of the solder bumps 41 may be, for example, approximately 100 to 200 μm.

Figure 9A:
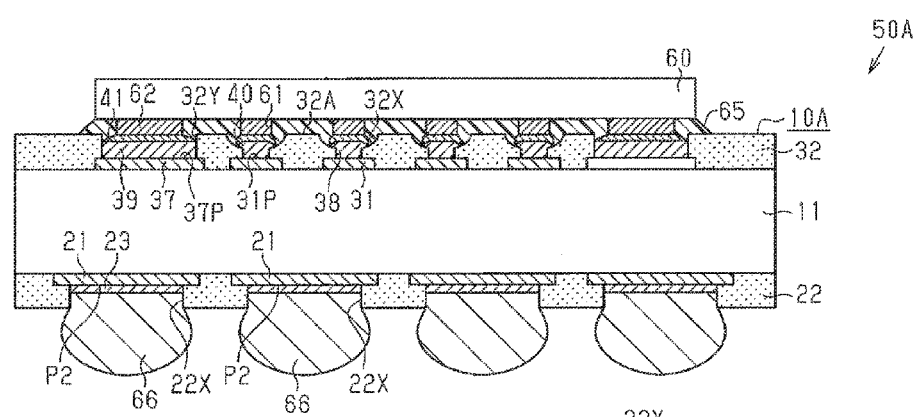
FIG. 9A is a schematic cross-sectional view of a semiconductor device including the wiring substrate of FIG. 7A.

The structure of a semiconductor device 50A will now be described with reference to FIGS. 9A and 9B. As illustrated in FIG. 9A, the semiconductor device 50A includes the wiring substrate 10A, one or more (here, one) semiconductor chips 60, the underfill 65, and the external connection terminals 66.

Figure 9B:
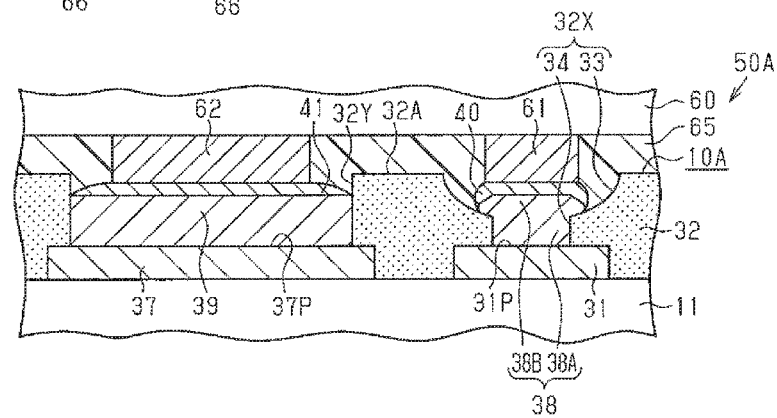
FIG. 9B is a partially enlarged cross-sectional view of the semiconductor device illustrated in FIG. 9A.

As illustrated in FIG. 9B, the semiconductor chip 60 includes a circuit formation surface (here, lower surface) on which connection terminals 61, 62 are formed. The connection terminals 61 are arranged to be opposed to the surface finish layer 38 (pads 31P). The connection terminals 62 are arranged to be opposed to the surface finish layer 39 (pads 37P). The semiconductor chip 60 is flip-chip-mounted on the wiring substrate 10A. The connection terminals 61 of the semiconductor chip 60 are electrically connected to the surface finish layer 38 by the solder bumps 40. Also, the connection terminals 62 of the semiconductor chip 60 are electrically connected to the surface finish layer 39 by the solder bumps 41.

Each of the connection terminals 61, 62 may be, for example, a metal post. The connection terminals 61, 62 are rod-shaped or column-shaped and downwardly extend from the circuit formation surface of the semiconductor chip 60. In the present example, the connection terminals 61, 62 are circular rod-shaped. The diameter of each connection terminal 62 is set to be, for example, larger than the diameter of each connection terminal 61. The material of the connection terminals 61, 62 may be, for example, copper or a copper alloy. Instead of the metal posts, for example, metal bumps such as gold bumps may be used as the connection terminals 61, 62.

A method for manufacturing the wiring substrate 10A will now be described.

In the step of FIG. 10A, the wiring layer 21 is formed on the lower surface of the substrate body 11. The wiring layers 31, 37 are formed on the upper surface of the substrate body 11. The wiring layers 31, 37, each of which is an uppermost wiring layer, are separated from each other and located on the same plane.

In the step of FIG. 10B, the solder resist layer 22 is formed on the lower surface of the substrate body 11 to cover the entire surfaces (lower and side surfaces) of the wiring layer 21. Also, the solder resist layer 32 is formed on the upper surface of the substrate body 11 to cover the entire surfaces (upper and side surfaces) of the wiring layers 31, 37. The solder resist layers 22, 32 may each be formed, for example, by laminating a photosensitive solder resist film or applying a liquid solder resist. In the present embodiment, a positive-type photosensitive resin is used as the material of the solder resist layers 22, 32. Alternatively, a negative-type photosensitive resin may be used as the material of the solder resist layers 22, 32.

In the step of FIG. 10C, photolithography is performed on the solder resist layer 22 to form the through holes 22X in the solder resist layer 22 at given locations. The through holes 22X partially expose the lower surface of the wiring layer 21 as the external connection pads P2. Also, photolithography is performed on the solder resist layer 32 to form the recesses 33 in the upper surface 32A of the solder resist layer 32 in portions overlapping with the wiring layer 31 in a plan view and the through holes 32Y, which extend through the solder resist layer 32 in the thickness-wise direction to partially expose the upper surface of the wiring layer 37 as the pads 37P.

Figure 11A:
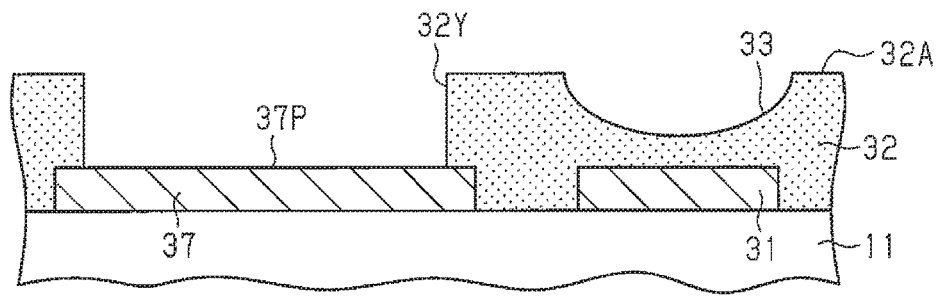

As illustrated in FIG. 11A, the bottom surface of the recess 33 is located at an intermediate position of the solder resist layer 32 in the thickness-wise direction. Thus, the recess 33 has a depth that does not reach the upper surface of the wiring layer 31. The recess 33 is semielliptical in a cross-sectional view. The through hole 32Y extends through the solder resist layer 32 in the thickness-wise direction to the upper surface of the wiring layer 37. The recess 33 and the through hole 32Y may be formed, for example, as follows.

The solder resist layer 32, which is formed from a positive-type photosensitive resin layer, undergoes exposure through a photo mask (not illustrated). The photo mask includes first openings at positions corresponding to the recesses 33 and second openings at positions corresponding to the through holes 32Y. In this case, the exposure amount (exposure time) and the transmittance to the first and second openings of the photo mask are adjusted so that the portions of the solder resist layer 32 overlapping with the wiring layer 31 in a plan view are exposed to the intermediate position in the thickness-wise direction while the portions of the solder resist layer 32 overlapping with the wiring layer 37 in a plan view are exposed to the depth that reaches the upper surface of the wiring layer 37. That is, the portions of the solder resist layer 32 overlapping with the wiring layer 31 in a plan view are exposed to the depth that does not reach the upper surface of the wiring layer 31. Then, the solder resist layer 32 is developed. The development removes the exposed portions of the solder resist layer 32 while non-exposed portions of the solder resist layer 32 remain. Consequently, the recesses 33 are formed in the upper surface 32A of the solder resist layer 32 at the positions of the wiring layer 31 while the through holes 32Y are formed to partially expose the upper surface of the wiring layer 37 as the pads 37P. Thus, the through holes 32Y are formed only through photolithography. Additionally, the conditions (exposure amount and development time) of photolithography is appropriately adjusted to form the curved wall surface of the recess 33.

Figure 11B:
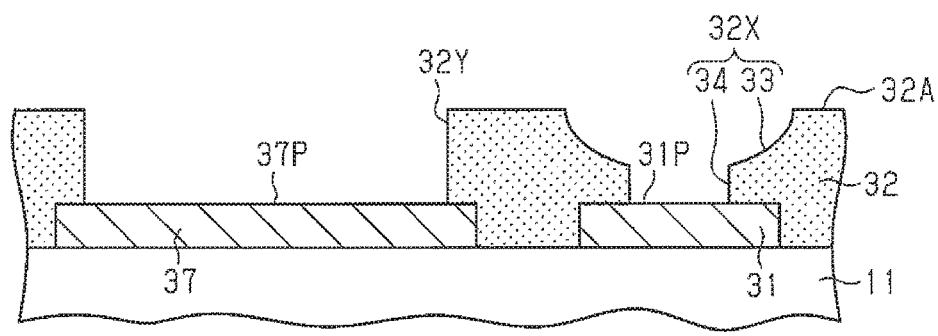

In the step of FIG. 11B, the opening 34 is formed in the bottom surface of the recess 33 to partially expose the upper surface of the wiring layer 31 as the pad 31P. The opening 34 extends through the solder resist layer 32 from the upper surface of the wiring layer 31 to the bottom surface of the recess 33 and is in communication with the recess 33. Consequently, the through hole 32X is formed by the recess 33 and the opening 34. The opening 34 may be formed through laser processing using a $CO_2$ laser, a YAG laser, or the like. When the opening 34 is formed through laser processing, the wall surface of the opening 34 is linear in a cross-sectional view. Additionally, the opening 34 formed through laser processing has a rough wall surface.

Then, a desmear process and Cu etching are performed to remove resin smears (resin residues) from the upper surface of the wiring layer 31 exposed by the through holes 32X.

Figure 11C:
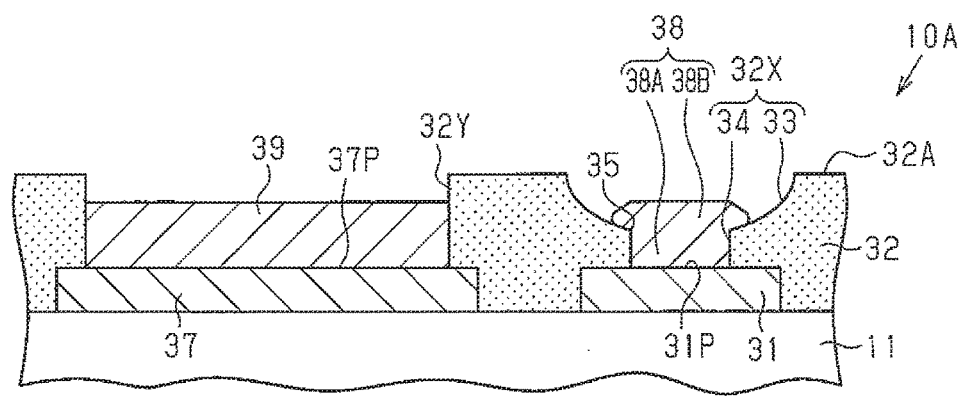

In the step of FIG. 11C, the surface finish layer 38 is formed on the entire upper surface of the wiring layer 31 exposed by the through holes 32X, and the surface finish layer 39 is formed on the entire upper surface of the wiring layer 37 exposed by the through holes 32Y. For example, when an Ni layer/Pd layer/Au layer is used as each of the surface finish layers 38, 39, an Ni layer, a Pd layer, and an Au layer are sequentially formed on the upper surface of the wiring layers 31, 37 to form the surface finish layers 38, 39. The Ni layer, the Pd layer, and the Au layer may be formed, for example, through electroless plating. The surface finish layers 38, 39 have, for example, substantially the same thickness.

Although not illustrated in the drawing, in the step of FIG. 11C, the surface finish layer 23 is also formed on the lower surface of the wiring layer 21 exposed by the through holes 22X, which are illustrated in FIG. 10C.

Figure 12A:
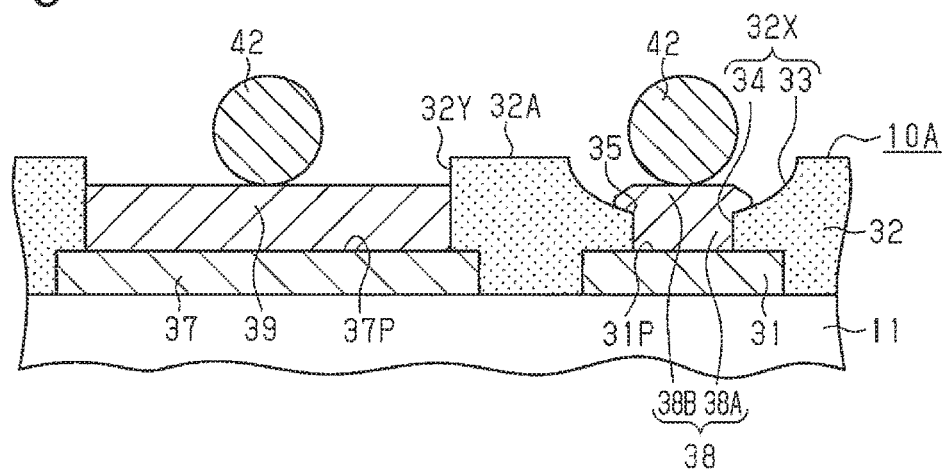

In the step of FIG. 12A, after a flux is appropriately applied to each of the surface finish layers 38, 39, the spherical solder balls 42 are mounted. For example, a transfer jig (not illustrated) is used to transfer the solder balls 42 into the through holes 32X of the solder resist layer 32.

Figure 12B:
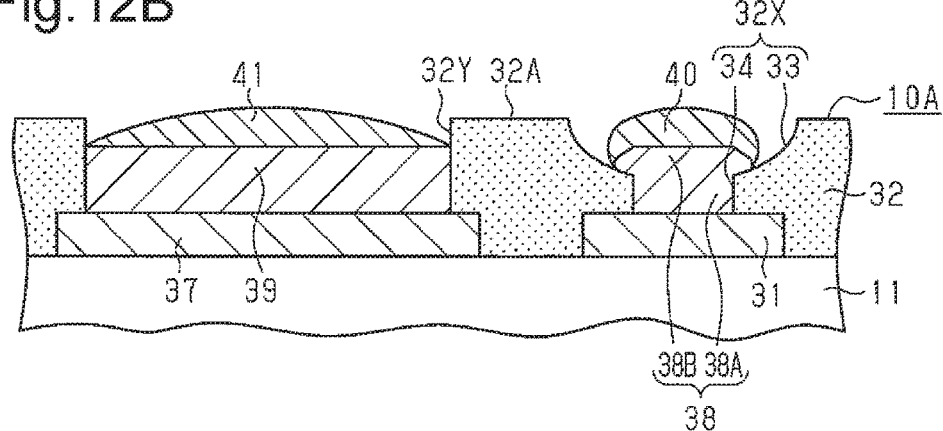

In the step of FIG. 12B, the wiring substrate 10, on which the solder balls 42 are mounted, undergoes the reflow process to form the solder bump 40 on the surface finish layer 38 and the solder bump 41 on the surface finish layer 39. At this time, the surface finish layer 38 covers the bottom of the recess 33. Thus, the solder ball 42, which is transferred into the through hole 32X, appropriately comes into contact with the upper surface of the surface finish layer 38. This limits formation of voids in the solder bump 40 during the reflow process.

When the flux is used to bond the solder bumps 40, 41 to the surface finish layers 38, 39, the residual flux is removed through cleaning. The above manufacturing steps manufacture the wiring substrate 10A illustrated in FIG. 7A.

A method for manufacturing the semiconductor device 50A will now be described with reference to FIG. 12C.

Figure 12C:
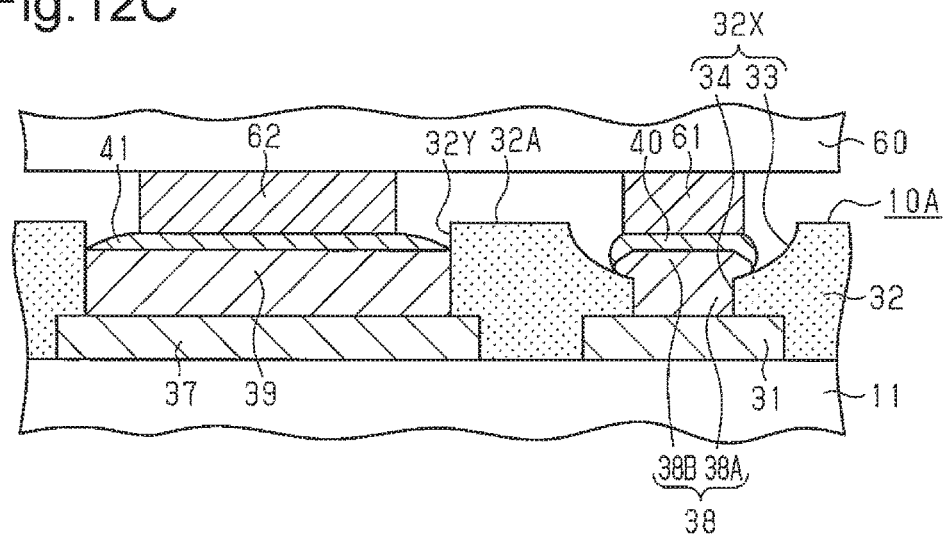
FIG. 12C is a schematic cross-sectional view of a method for manufacturing the semiconductor device of FIG. 9B subsequent to the step of FIG. 12B.

In the step of FIG. 12C, the semiconductor chip 60 including the circuit formation surface, on which the connection terminals 61, 62 are formed, is prepared. When the connection terminals 61, 62 are aligned with the solder bumps 40, 41, the reflow process is performed to melt the solder bumps 40, 41. This flip-chip-bonds the connection terminals 61, 62 of the semiconductor chip 60 to the solder bumps 40, 41 formed on the surface finish layers 38, 39. Consequently, the connection terminal 61 is electrically connected to the surface finish layer 38 by the solder bump 40, and the connection terminal 62 is electrically connected to the surface finish layer 39 by the solder bump 41.

Then, the gap between the semiconductor chip 60 and the wiring substrate 10A, which are flip-chip-bonded to each other, are filled with the underfill 65 (refer to FIG. 9A). Then, the underfill 65 is cured. Additionally, the external connection terminals 66 are formed on the surface finish layer 23, which is illustrated in FIG. 9A. The above manufacturing steps manufacture the semiconductor device 50A illustrated in FIG. 9A.

The second embodiment has the advantages described below in addition to advantages (1) to (3) and (7) of the first embodiment.

(8) The surface finish layer 38 is formed on the upper surface of the wiring layer 31 exposed by the openings 34. The upper surface of the surface finish layer 38 is located at a higher position than the corner 35 in each through hole 32X. Thus, when the solder ball 42 is transferred into the through hole 32X, the solder ball 42 appropriately comes into contact with the upper surface of the surface finish layer 38. This limits formation of voids in the solder bump 40.

(9) The surface finish layer 38 includes the base portion 38A, with which the opening 34 is filled, and the distal portion 38B, which has a larger diameter than the base portion 38A. This increases the area where the surface finish layer 38 (distal portion 38B) is bonded to the solder bump 40. Consequently, the reliability for bonding the surface finish layer 38 and the solder bump 40 is increased.

It should be apparent to those skilled in the art that the foregoing embodiments may be employed in many other specific forms without departing from the scope of this disclosure. Particularly, it should be understood that the foregoing embodiments may be employed in the following forms.

Figure 13:
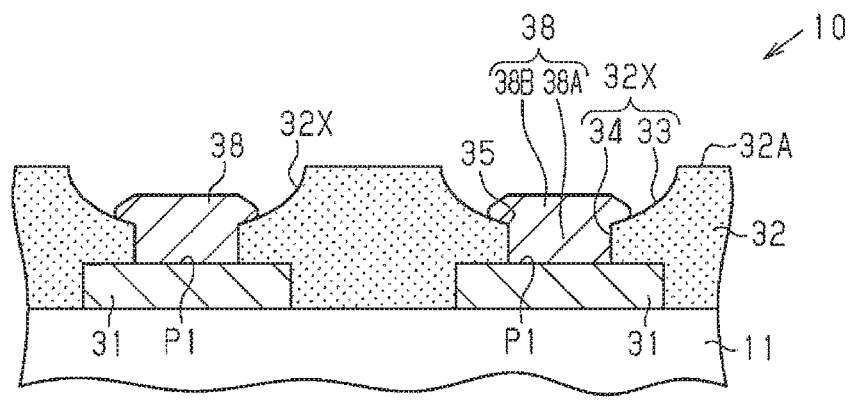
FIGS. 13 to 16 are schematic cross-sectional views illustrating various modified examples of a wiring substrate.

As illustrated in FIG. 13, in the wiring substrate 10 of the first embodiment, the surface finish layer 38 including the base portion 38A and the distal portion 38B may be formed on the upper surface of the wiring layer 31 exposed by the through holes 32X.

Figure 14:
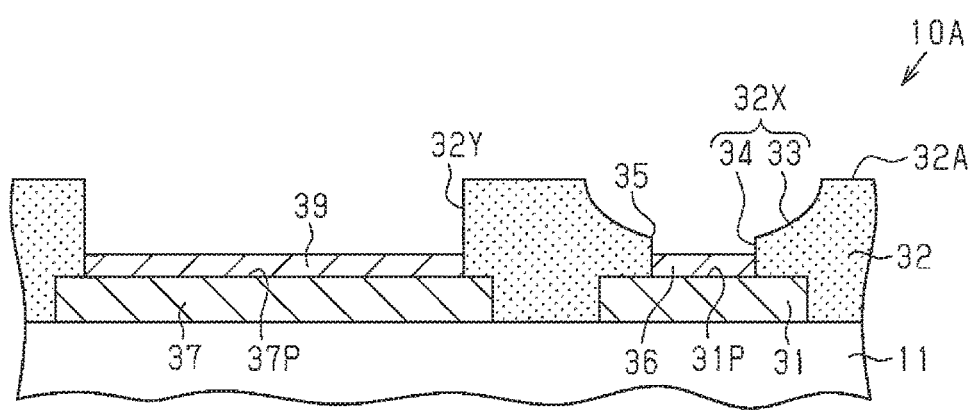

As illustrated in FIG. 14, in the wiring substrate 10A of the second embodiment, the surface finish layer 36 may be formed on the upper surface of the wiring layer 31 exposed by the through hole 32X. The upper surface of the surface finish layer 36 is located at a lower position than the corner 35 in the through hole 32X. In this case, the surface finish layer 39 and the surface finish layer 36 may have substantially the same thickness.

In each embodiment, the wiring substrate 10 (or wiring substrate 10A) may include the through holes 32X in which the surface finish layer 36 is formed and the through holes 32X in which the surface finish layer 38 is formed.

Figure 15:
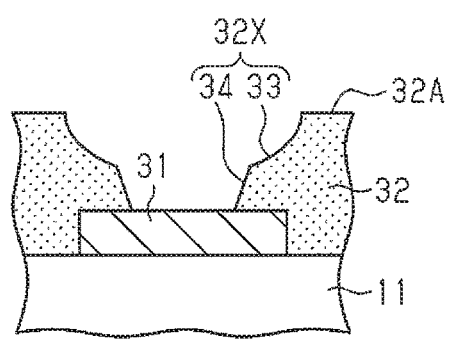

As illustrated in FIG. 15, in each embodiment, the opening 34 may be tapered in the through hole 32X. Referring to FIG. 15, for example, the opening 34 may be tapered so that the diameter decreases from the upper end of the opening 34 (bottom of recess 33) toward the lower end of the opening 34 (upper surface of wiring layer 31).

In each embodiment, the wall surface defining the recess 33 of the through hole 32X is elliptically arcuate in a cross-sectional view. Instead, the wall surface of the recess 33 may be, for example, circularly arcuate or parabolic in a cross-sectional view.

Figure 16:
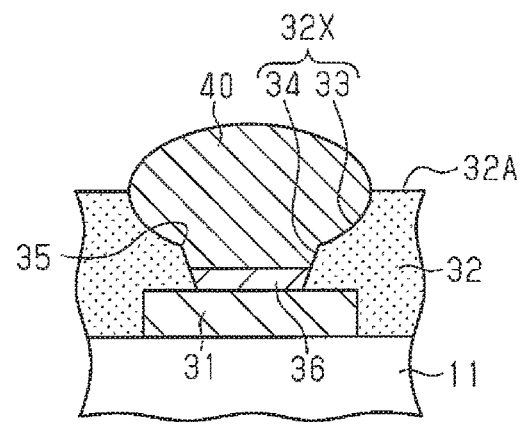

As illustrated in FIG. 16, the recess 33 may be filled with the solder bump 40. In this modified example, the solder bump 40 is formed on the upper surface of the surface finish layer 36, and the opening 34 and the recess 33 are filled with the solder bump 40. In the modified example, the solder bump 40 upwardly projects from the upper surface 32A of the solder resist layer 32.

In the modified example of FIG. 16, the solder bump 40 is formed on the surface finish layer 36. Instead, the solder bump 40 may be formed on the upper surface of the surface finish layer 38 to fill the recess 33 with the solder bump 40. That is, in the modified example of FIG. 16, the surface finish layer 36 may be replaced by the surface finish layer 38 illustrated in FIG. 7B.

In each embodiment, the solder balls 42 are mounted on the surface finish layers 36, 38, 39 and melted to form the solder bumps 40, 41. Instead, for example, solder plating may be performed to form solder bumps on the surface finish layers 36, 38, 39.

In each embodiment, the solder bumps 40 are formed on the surface finish layers 36, 38, and the solder bumps 41 are formed on the surface finish layer 39. Instead, metal posts may be formed on the surface finish layers 36, 38, 39. The metal posts may be formed, for example, through electroless plating or electrolytic plating.

In each embodiment, the surface finish layers 36, 38, 39 may be omitted from the wiring substrates 10, 10A.

In each embodiment, the solder resist layers 22, 32 are each illustrated as one example of a protective insulation layer, which corresponds to the outermost layer of each of the wiring substrates 10, 10A. Instead, the protective insulation layer may be formed from a photosensitive insulation resin.

The wiring substrates 10, 10A of the embodiments may be applied to a wiring substrate used for a package such as a chip size package (CPS) or a small outline non-lead package (SON).

The above embodiments and modified examples may be combined.

Clauses

This disclosure further encompasses the following embodiments.

1. A method for manufacturing a wiring substrate, the method including:
    forming a protective insulation layer to cover a first wiring layer that is an uppermost wiring layer;
    performing photolithography to form a recess in an upper surface of the protective insulation layer at a portion overlapping the first wiring layer in a plan view, wherein the recess is defined by a curved wall surface; and performing laser processing to form an opening that extends from an upper surface of the first wiring layer to a bottom of the recess and is in communication with the recess, wherein the opening is smaller than the recess in a plan view, and the opening partially exposes the upper surface of the first wiring layer.

2. A method for manufacturing a wiring substrate, the method including:

forming a first wiring layer and a second wiring layer that are uppermost wiring layers, wherein the first wiring layer and the second wiring layer are separated from each other on the same plane;

forming a protective insulation layer that covers the first wiring layer and the second wiring layer;

performing photolithography to form a recess and a through hole, wherein the recess is located in an upper surface of the protective insulation layer at a portion overlapping the first wiring layer in a plan view, the recess is defined by a curved wall surface, and the through hole extends through the protective insulation layer in a thickness-wise direction to partially expose an upper surface of the second wiring layer; and performing laser processing to form an opening, wherein the opening extends from an upper surface of the first wiring layer to a bottom of the recess and is in communication with the recess, the opening is smaller than the recess in a plan view, and the opening partially exposes the upper surface of the first wiring layer, wherein the through hole is larger than the recess in a plan view.

3. The Method According to Clause 1 or 2, Further Including:

forming a surface finish layer on the upper surface of the first wiring layer exposed by the opening;

mounting a solder ball on an upper surface of the surface finish layer; and forming a solder bump on the upper surface of the surface finish layer by melting the solder ball through a reflow process.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a first wiring layer that is an uppermost wiring layer;
a protective insulation layer that covers the first wiring layer;
a first through hole that extends through the protective insulation layer in a thickness-wise direction to partially expose an upper surface of the first wiring layer, the first through hole including:
a recess defined in an upper surface of the protective insulation layer by a curved wall surface, and
an opening that extends from the upper surface of the first wiring layer to a bottom of the recess and is in communication with the recess, wherein the opening is smaller than the recess in a plan view;
a surface finish layer formed on the upper surface of the first wiring layer exposed by the opening; and
a solder bump bonded to the surface finish layer,
wherein an upper surface of the surface finish layer is located at a lower position than a corner that connects a lower end of the wall surface of the recess and an upper end of a wall surface of the opening, and
wherein an upper surface of the solder bump is located at a position that is higher than the corner and lower than the upper surface of the protective insulation layer.

2. The wiring substrate according to claim 1, wherein the first through hole has the form of a stemmed bowl.

3. A semiconductor device comprising:
the wiring substrate according to claim 1; and
a semiconductor chip including a connection terminal bonded to the solder bump, wherein the semiconductor chip is flip-chip-mounted on the wiring substrate.

4. A wiring substrate comprising:
a first wiring layer that is an uppermost wiring layer;
a second wiring layer that is an uppermost wiring layer, wherein the first wiring layer and the second wiring layer are separated from each other on the same plane;
a protective insulation layer that covers the first wiring layer and the second wiring layer;
a first through hole that extends through the protective insulation layer in a thickness-wise direction to partially expose an upper surface of the first wiring layer; and
a second through hole that extends through the protective insulation layer in the thickness-wise direction to partially expose an upper surface of the second wiring layer, wherein
the first through hole includes
a recess defined in an upper surface of the protective insulation layer by a curved wall surface, and
an opening that extends from the upper surface of the first wiring layer to a bottom of the recess and is in communication with the recess, wherein the opening is smaller than the recess in a plan view,
the first through hole is defined by a wall surface that includes a step at an intermediate position in the thickness-wise direction, wherein the step defines the recess and the opening,
the second through hole is larger than the recess in a plan view, and
the second through hole is defined by a wall surface that is free of a step at an intermediate position in the thickness-wise direction.

5. The wiring substrate according to claim 4, further comprising a surface finish layer formed on the upper surface of the first wiring layer exposed by the opening,
wherein an upper surface of the surface finish layer is located at a lower position than a corner that connects a lower end of the wall surface of the recess and an upper end of a wall surface of the opening.

6. The wiring substrate according to claim 5, further comprising a solder bump bonded to the surface finish layer.

7. The wiring substrate according to claim 4, further comprising a surface finish layer located on the upper surface of the first wiring layer exposed by the opening,
wherein an upper surface of the surface finish layer is located at a higher position than a corner that connects a lower end of the wall surface of the recess and an upper end of a wall surface of the opening.

8. The wiring substrate according to claim 7, wherein the surface finish layer includes
a base portion with which the opening is filled, and a distal portion located in a bottom of the recess, wherein the distal portion is larger than the base portion in a plan view.

9. The wiring substrate according to claim 7, further comprising a solder bump bonded to the surface finish layer.

10. The wiring substrate according to claim 4, wherein the first through hole has the form of a stemmed bowl.

11. A semiconductor device comprising:
the wiring substrate according to claim 6; and
a semiconductor chip including a connection terminal bonded to the solder bump, wherein the semiconductor chip is flip-chip-mounted on the wiring substrate.

12. A semiconductor device comprising:
the wiring substrate according to claim 9; and
a semiconductor chip including a connection terminal bonded to the solder bump, wherein the semiconductor chip is flip-chip-mounted on the wiring substrate.

* * * * *